United States Patent
Anc et al.

(10) Patent No.: US 11,271,141 B2
(45) Date of Patent: Mar. 8, 2022

(54) LIGHT-EMITTING DEVICE WITH WAVELENGHT CONVERSION LAYER HAVING QUANTUM DOTS

(71) Applicant: OSRAM Opto Semiconductors GmbH, Regensburg (DE)

(72) Inventors: Maria J. Anc, Groveland, MA (US); Darshan Kundaliya, Middleton, MA (US); Madis Raukas, Lexington, MA (US); David O'Brien, Portland, OR (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 113 days.

(21) Appl. No.: 16/199,755

(22) Filed: Nov. 26, 2018

(65) Prior Publication Data
US 2020/0168771 A1 May 28, 2020

(51) Int. Cl.
| | |
|---|---|
| *H01L 33/50* | (2010.01) |
| *H01L 33/00* | (2010.01) |
| *H01L 33/22* | (2010.01) |
| *H01L 33/54* | (2010.01) |

(52) U.S. Cl.
CPC ........ *H01L 33/505* (2013.01); *H01L 33/0066* (2013.01); *H01L 33/22* (2013.01); *H01L 33/54* (2013.01); *H01L 33/502* (2013.01); *H01L 2933/0041* (2013.01)

(58) Field of Classification Search
CPC ......... H01L 33/00; H01L 33/54; H01L 33/22; H01L 33/505; H01L 33/0066; H01L 33/502; H01L 2933/0041; F21K 99/00
See application file for complete search history.

(56) References Cited

U.S. PATENT DOCUMENTS

| | | | | |
|---|---|---|---|---|
| 6,458,612 | B1* | 10/2002 | Chen | H01L 33/0066 438/29 |
| 2009/0078954 | A1* | 3/2009 | Shim | H01L 33/22 257/98 |
| 2011/0069369 | A1* | 3/2011 | Park | G02B 26/0833 359/230 |
| 2011/0244610 | A1* | 10/2011 | Saito | H01L 33/007 438/29 |
| 2011/0278537 | A1* | 11/2011 | Lee | H01L 33/04 257/13 |
| 2013/0015487 | A1* | 1/2013 | Okuno | H01L 33/20 257/98 |
| 2013/0277700 | A1* | 10/2013 | Matsumura | H01L 33/50 257/98 |
| 2013/0328056 | A1* | 12/2013 | Kwon | H01L 33/32 257/76 |
| 2014/0233212 | A1* | 8/2014 | Park | G02F 1/133606 362/84 |
| 2014/0264412 | A1* | 9/2014 | Yoon | H01L 33/504 257/98 |

(Continued)

*Primary Examiner* — Sheng-Bai Zhu
(74) *Attorney, Agent, or Firm* — Slater Matsil, LLP

(57) ABSTRACT

A light-emitting device including a light-emitting semiconductor chip having a semiconductor layer sequence having at least one light-emitting semiconductor layer and a light-outcoupling surface, the light-emitting device further including a wavelength conversion layer arranged on the light-outcoupling surface, the wavelength conversion layer including quantum dots.

16 Claims, 6 Drawing Sheets

(56) References Cited

U.S. PATENT DOCUMENTS

| | | | |
|---|---|---|---|
| 2014/0319560 A1* | 10/2014 | Tischler | H01L 33/505 |
| | | | 257/98 |
| 2015/0021549 A1 | 1/2015 | Zhang et al. | |
| 2015/0028374 A1* | 1/2015 | Yeh | G01J 5/60 |
| | | | 257/98 |
| 2015/0185381 A1* | 7/2015 | Wu | G02F 1/133617 |
| | | | 349/106 |
| 2015/0364639 A1* | 12/2015 | Hong | H01L 24/97 |
| | | | 438/7 |
| 2016/0043282 A1* | 2/2016 | Chae | H01L 33/46 |
| | | | 257/98 |
| 2016/0095184 A1 | 3/2016 | Nakabayashi et al. | |
| 2016/0197229 A1 | 7/2016 | Park et al. | |
| 2016/0308089 A1 | 10/2016 | Kim et al. | |
| 2016/0351764 A1* | 12/2016 | Cha | H01L 33/58 |
| 2017/0062770 A1* | 3/2017 | Jang | H01L 51/5012 |
| 2017/0133357 A1 | 5/2017 | Kuo et al. | |
| 2018/0198034 A1 | 7/2018 | O'Brien et al. | |
| 2018/0348577 A1* | 12/2018 | Pousthomis | H01L 33/50 |
| 2019/0137815 A1* | 5/2019 | Kim | H01L 51/5221 |

\* cited by examiner

LIGHT-EMITTING DEVICE WITH WAVELENGHT CONVERSION LAYER HAVING QUANTUM DOTS

TECHNICAL FIELD

Embodiments of a light-emitting device and a method for manufacturing a light-emitting device are described herein. In particular, the light-emitting device can have a wavelength conversion layer. The wavelength conversion layer can preferably comprise or substantially consist of quantum dots (QDs).

BACKGROUND

Quantum dots are narrow-band emitters which are used for wavelength conversion. They can offer benefits of color quality and conversion efficiency for instance in backlighting and solid-state lighting (SSL) applications. Quantum dots are suitable for such applications by providing not only specific optical properties but also a potential for cost-efficient manufacturing. QDs have a broad absorption spectrum in a wavelength range that usually goes from ultraviolet wavelengths up to the first excitonic peak. They are non-scattering and efficient. The peak emission wavelength of QDs can be tuned within just a few nanometers.

Contemporary colloidal QDs in dispersions usually exhibit a high efficiency of typically more than 80% or even more than 90% in large volumes in non-polar solvents and between about 70% and 80% in optimized polymer composites. In colloidal dispersions QDs are usually coated with organic ligands, passivating the surface, preventing agglomeration and enabling their miscibility with host materials. However, the nature of these ligands affects the feasibility of formulating the QD composites as well as their performance in applications. At present, QD/polymer composites are employed in back lighting and SSL applications as the remote color correcting films. The properties of the QD/polymer composites are satisfactory for such applications where the operation temperature does not exceed 100° C. For applications where the converter may reach temperatures greater than 100° C., other forms of QD films need to be made. According to the state of the art, QD formulations and host materials are used which exhibit greater thermal conductivity and heat endurance.

Typically, optical components with QDs are being fabricated as free standing parts with the application-specific form factor. They may comprise compositions of the QDs with polymers, hybrid organic/inorganic substances, and may also form dense assemblies on a supporting substrate. To prevent degradation of the QD properties in the ambient atmosphere, these components need to be encapsulated. Challenges for the design and fabrication of QD converters intended to work at elevated temperatures originate from the necessity of eliminating organic host materials. In such cases, free standing QD assemblies having the form of densely-packed films or compositions of QDs with inorganic fillers may be applicable. However, the free standing QD parts have to be attached to the light-source in a package, which, in connection with a volume production, introduces fabrication process complexity and increases the costs.

SUMMARY

Embodiments described herein provide a light-emitting device and a method for manufacturing a light-emitting device.

According to at least one embodiment, a light-emitting device comprises a light-emitting semiconductor chip and a wavelength conversion layer.

According to at least one further embodiment, in a method for manufacturing a light-emitting device, a light-emitting semiconductor chip is provided or produced, and a wavelength conversion layer is arranged on the light-emitting semiconductor chip.

The features and embodiments described herein relate to both the light-emitting device and the method for manufacturing the light-emitting device, respectively.

According to a further embodiment, the light-emitting semiconductor chip has a semiconductor layer sequence. The semiconductor layer sequence comprises at least one light-emitting semiconductor layer. The at least one light-emitting semiconductor layer forms an active region for generating light, so when the light-emitting semiconductor chip is operated, light is produced in the light-emitting semiconductor layer. The light-emitting semiconductor chip further comprises a light-outcoupling surface, via which the light that is produced in the active region is coupled out of the light-emitting semiconductor chip. The wavelength conversion layer is preferably arranged on the light-outcoupling surface.

The semiconductor layer sequence can be grown particularly preferably on a substrate, which can be denoted as the growth substrate, by means of an epitaxy technique, for instance by means of metalorganic vapor phase epitaxy (MOVPE) or molecular beam epitaxy (MBE). The semiconductor layer sequence as a result comprises semiconductor layers that are arranged one above the other along an arrangement direction given by the growth direction, which can also be denoted as the vertical direction. The layers of the semiconductor layer sequence have a main extension plane that is perpendicular to the arrangement direction. Directions parallel to the main extension plane of the semiconductor layers and thus perpendicular to the vertical direction can be referred to as lateral directions.

The light-emitting semiconductor chip in particular comprises two main surfaces, which are disposed perpendicular to the growth direction. One of the main surfaces is embodied as the light-outcoupling surface, via which the light that is generated during operation of the light-emitting semiconductor chip is emitted. In addition, the light-emitting semiconductor chip comprises a rear face, which is on the opposite side from the light-outcoupling surface and forms the second main surface of the light-emitting semiconductor chip. The light-outcoupling surface and the rear face are connected together via side faces. In addition to light being emitted by the light-outcoupling surface, at least some of the light generated in the light-emitting semiconductor layer during operation may also be emitted via a side face and/or the rear face.

The light-emitting semiconductor chip can have a semiconductor layer sequence based on different semiconductor material systems depending on the light to be generated. A semiconductor layer sequence based on $In_xGa_yAl_{1-x-y}As$, for instance, is suitable for a long-wavelength infrared to red emission, a semiconductor layer sequence based on $In_xGa_yAl_{1-x-y}P$, for instance, is suitable for red to yellow radiation, and a semiconductor layer sequence based on $In_xGa_yAl_{1-x-y}N$, for instance, is suitable for short-wavelength visible radiation, i.e. in particular for green to blue radiation, and/or for UV radiation, where $0 \geq x \geq 1$ and $0 \geq y \geq 1$ in each case. In addition, a semiconductor layer sequence based on an antimonide, for example InSb, GaSb, AlSb or a combination thereof, can be suitable for long-wavelength infrared radiation.

The substrate, in particular in the case of a substrate which is a growth substrate, can comprise or can be an insulating material or a semiconductor material, for instance an aforementioned compound semiconductor material system. In particular, the growth substrate can comprise or be made of sapphire, GaAs, GaP, GaN, InP, SiC, Si and/or Ge.

The growth process can take place in particular in a wafer-based process. In other words, a growth substrate is provided in the form of a wafer, on which the semiconductor layer sequence is grown over a large area. The grown semiconductor layer sequence can be singulated into individual light-emitting semiconductor chips in a further method step, in which the side faces of the light-emitting semiconductor chips can be formed by the singulation. The wavelength conversion layer can preferably be applied before the singulation takes place. In other words, the wavelength conversion layer can be applied also in a wafer-based process. Alternatively, the wavelength conversion layer can be applied on an already singulated light-emitting semiconductor chip.

In addition, the semiconductor layer sequence can be transferred to a carrier substrate prior to singulation, and the growth substrate can be thinned, i.e. removed at least in part or entirely. The carrier substrate can comprise or be made of an electrically insulating or electrically conducting material, for instance a substrate material described above.

The semiconductor layer sequence of the light-emitting semiconductor chip can comprise for instance a conventional p-n junction, a double heterostructure, a single quantum well structure (SQW structure) or a multi-quantum well structure (MQW structure) as the light-emitting semiconductor layer. In addition to the at least one light-emitting semiconductor layer, the semiconductor layer sequence can include further functional layers and functional regions, for instance p-type and n-type charge carrier transport layers, undoped or p-type or n-type confinement, cladding or waveguide layers, barrier layers, planarization layers, buffer layers, protective layers and/or electrodes, and combinations thereof. In particular, for making electrical contact on the light-outcoupling surface and on the rear face, the light-emitting semiconductor chip can comprise for each case an electrical contact element, for instance in the form of an electrode layer which covers a large surface area or a small surface area or which can be a patterned electrode layer. It is also possible that all electrical contacts are provided on a same side of the light-emitting semiconductor chip, for instance on the light-outcoupling surface or on the rear surface. In particular, the light-emitting semiconductor chip can be embodied as a so-called volume emitter or as a flip-chip, in both cases preferably comprising a semiconductor layer sequence grown on a sapphire substrate, or as a so-called thin-film semiconductor chip, preferably comprising a carrier substrate onto which the semiconductor layer sequence has been transferred after the growth process and preferably further having a thinned or even completely removed growth substrate.

The structures described here relating to the light-emitting semiconductor chip as well as the light-emitting semiconductor layer and the further functional layers and regions, in particular the design, function and construction thereof, are known to a person skilled in the art and therefore are not described in greater detail here.

According to a further embodiment, the wavelength conversion layer comprises quantum dots (QDs). As described above, there are benefits of color performance provided by the QDs, in particular a narrow-band emission with a fine-tunable peak position, a broad absorption spectrum and no inherent scattering.

According to a further embodiment, the wavelength conversion layer is free of an organic matrix material. In particular, the wavelength conversion layer can substantially consist of the quantum dots. In other words, the wavelength conversion layer is not formed as a composite comprising a matrix material or filler material such as a polymer or other organic materials, which are typically used in the prior art. In contrast, the wavelength conversion layer of the light-emitting device is preferably embodied as an assembly of the QDs, which are deposited on a surface of the light-emitting semiconductor chip, so that the wavelength conversion layer is formed by the deposition process. Consequently, the wavelength conversion layer is not a free standing component as usually used in the art, but is a part of the light-emitting device that is integrated in the light-emitting device and that cannot be removed without being destroyed. In particular, the QDs are arranged next to each other and/or on top of each other by the deposition process, thereby forming the wavelength conversion layer. The wavelength conversion layer can be deposited preferably by at least one method chosen from drop-casting, inkjet printing, layer transfer. Furthermore, the wavelength conversion layer can be deposited directly on a surface of the light-emitting semiconductor chip, in particular directly on the light-outcoupling surface, so that at least some of the QDs of the wavelength conversion layer can be in direct contact with the light-outcoupling surface of the light-emitting semiconductor chip.

Furthermore, an interlayer can be arranged on a surface of the light-emitting semiconductor chip, in particular on the light-outcoupling surface and preferably directly on the light-outcoupling surface, and the wavelength conversion layer can be deposited on the interlayer, in particular directly on the interlayer. The interlayer can comprise or consist of a transparent material and/or a wavelength conversion material. The wavelength conversion material, which can be different from QDs, can be suitable for converting at least some of the light emitted by the light-emitting semiconductor chip into light of a different wavelength. Preferably, when irradiated with the light of the light-emitting semiconductor chip, the wavelength conversion material of the interlayer can emit light with a wavelength that is different from the wavelength of the light that is emitted by the wavelength conversion layer. In particular, the interlayer can comprise a ceramic wavelength conversion material, which for instance can be provided as a ceramic layer or as particles dispersed in a matrix material. The wavelength conversion material of the interlayer can comprise for example a material from the group of the garnets, for example yttrium aluminum garnet (YAG) and/or lutetium aluminum garnet (LuAG), and, in particular, doped garnets as for instance Ce-doped garnets. By combining the light-emitting semiconductor chip, the wavelength conversion layer with the QDs and the interlayer with the wavelength conversion material, the light-emitting device can be for instance a white-light-emitting device with an integrated QD layer. The interlayer, preferably comprising or consisting of a wavelength conversion material, can in particular be deposited on the light-outcoupling surface by a pulsed laser deposition (PLD) process.

According to a further embodiment, a surface structure is provided on the light-outcoupling surface and the wavelength conversion layer is deposited directly on the surface structure. The surface structure can comprise indentations like pits and/or crevices and/or grooves as well as elevations like tips and/or peaks and/or dam-like structures. Preferably, the light-outcoupling surface can be provided with the surface structure. In this case, the wavelength conversion layer is deposited directly on the surface structure of the light-outcoupling surface. In the case of an interlayer, preferably an interlayer comprising or consisting of a wavelength conversion material, the interlayer has a surface that is remote from the light-outcoupling surface and that can have the surface structure. In this case, the wavelength conversion layer is directly deposited on the surface structure of the interlayer.

The wavelength conversion layer can be a conformal coating of the surface structure. In other words, the wavelength conversion layer can cover the surface structure in such way that the structure of the wavelength conversion layer on the side remote from the surface structure at least partly resembles the surface structure and thus is at least partly similar to the surface structure. Furthermore, the wavelength conversion layer can at least partly planarize the surface structure by at least partly filling indentations of the surface structure.

According to a further embodiment, the light-emitting semiconductor chip comprises a substrate with a first main surface and a second main surface, which are opposite to each other, wherein the semiconductor layer sequence is arranged on the first main surface and the wavelength conversion layer is arranged on the second main surface. In a preferred embodiment, the second main surface is the light-outcoupling surface. The second main surface can have the surface structure. Alternatively, an interlayer as described above is arranged on the light-outcoupling surface formed by the second main surface. Furthermore, the first main surface of the substrate can have a further surface structure and the semiconductor layer sequence is grown on the further surface structure.

According to a further embodiment, the substrate with the first main surface is provided and the semiconductor layer sequence is arranged, preferably grown, on the first main surface. In particular, the semiconductor layer sequence is grown on the substrate in a wafer-based process as described above. Afterwards, the wavelength conversion layer is deposited on the second main surface, which can be the light-outcoupling surface.

In cases where the second main surface of the substrate has a surface structure, onto which the wavelength conversion layer is deposited, the surface structure is produced in the second main surface, so that the second main surface is provided with the surface structure before or after the semiconductor layer sequence is arranged on the first main surface.

For instance, the surface structure is provided in the second main surface before the semiconductor layer sequence is arranged on the first main surface. In this case, it can be preferable that the substrate is arranged with the second main surface and thus with the surface structure on a temporary carrier before the semiconductor layer sequence is arranged on the first main surface. The temporary carrier can be removed after the arrangement of the semiconductor layer sequence on the first main surface, thereby exposing the surface structure on the second main surface. Alternatively, the surface structure can be provided on the second main surface after the semiconductor layer sequence is arranged on the first main surface. In this case, it can be preferable that the substrate is thinned before the surface structure is provided in the second main surface and after the semiconductor layer sequence is arranged on the first main surface. By means of the thinning process the second surface can be produced.

According to a further embodiment, the light-outcoupling surface is a surface of the semiconductor layer sequence, in particular of an outermost semiconductor layer of the semiconductor layer sequence. In this case, the outermost semiconductor layer can have the surface structure. Alternatively, an interlayer as described above can be arranged on the outermost semiconductor layer.

According to a further embodiment, an encapsulation layer is arranged on the wavelength conversion layer. Preferably, the encapsulation layer is transparent and can be arranged directly on the wavelength conversion layer. This can in particular mean that the encapsulation layer is arranged in direct contact with at least some of the QDs of the wavelength conversion layer. The encapsulation layer can comprise or consist of one or more layers which are responsible for a barrier effect of the encapsulation layer. The one or more layers can comprise one or more inorganic and/or organic materials. Inorganic materials can be applied, for example, by means of atomic layer deposition (ALD), sputtering or plasma-enhanced chemical vapor deposition (PECVD). Suitable inorganic materials can be, for example, transparent inorganic materials such as aluminum oxide, zinc oxide, zirconium oxide, titanium oxide, hafnium oxide, lanthanum oxide, silicon nitride, silicon oxide, silicon oxynitride, silicon carbide, indium tin oxide, indium zinc oxide, aluminum-doped zinc oxide, and mixtures and alloys thereof. Suitable organic materials can be, for example, transparent polymers containing siloxanes, epoxides, imides, carbonates, acrylates and mixtures and combinations thereof. The encapsulation layer may have a layer sequence having a plurality of layers, for instance a plurality of only inorganic layers or a plurality of inorganic and organic layers, which are alternately arranged on top of each other.

Further features, advantages and expediencies will become apparent from the following description of exemplary embodiments in conjunction with the Figures.

BRIEF DESCRIPTION OF THE DRAWINGS

For a more complete understanding of the present invention, and the advantages thereof, reference is now made to the following descriptions taken in conjunction with the accompanying drawings, in which.

In the Figures, elements of the same design and/or function are identified by the same reference numerals. It is to be understood that the embodiments shown in the Figures are illustrative representations and are not necessarily drawn to scale.

DETAILED DESCRIPTION OF ILLUSTRATIVE EMBODIMENTS

In the following, specific details are set forth, such as specific features and advantageous effects of a light-emitting device and of a method for manufacturing a light-emitting device, in order to provide a thorough understanding of embodiments of the invention. It will be apparent to one skilled in the art that embodiments of the invention may be practiced without these specific details.

Figure 1A:
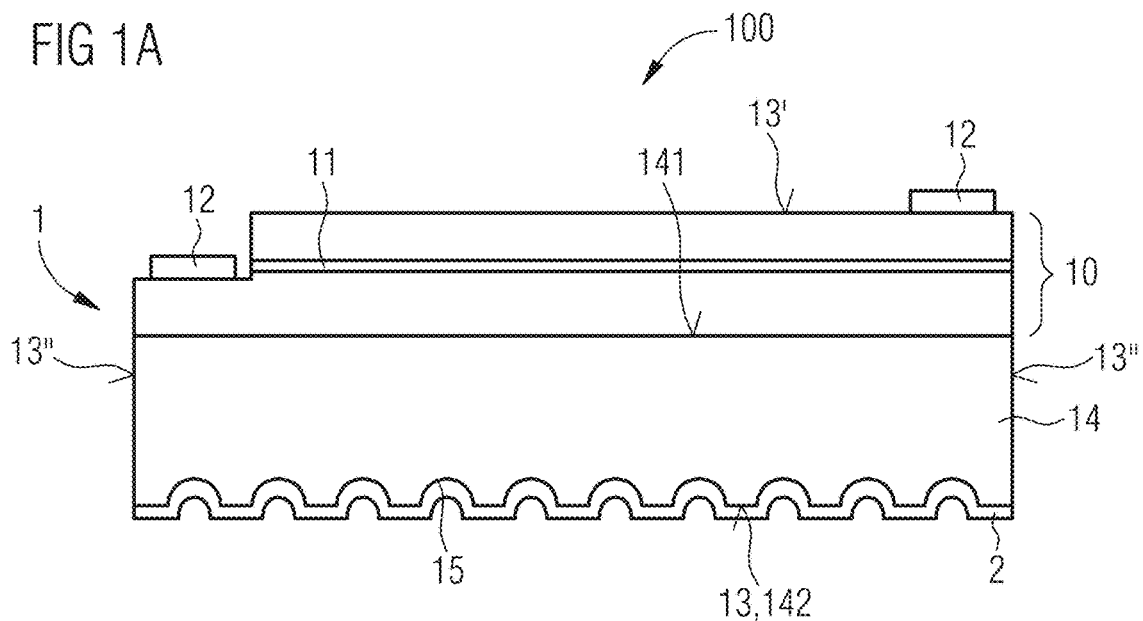
FIGS. 1A to 1C show schematic illustrations of a light-emitting device according to an embodiment.
Figure 1B:
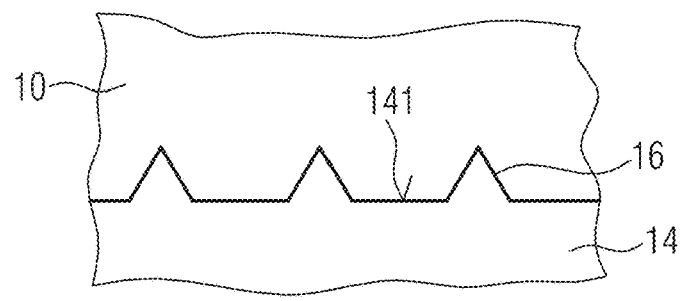
Figure 1C:
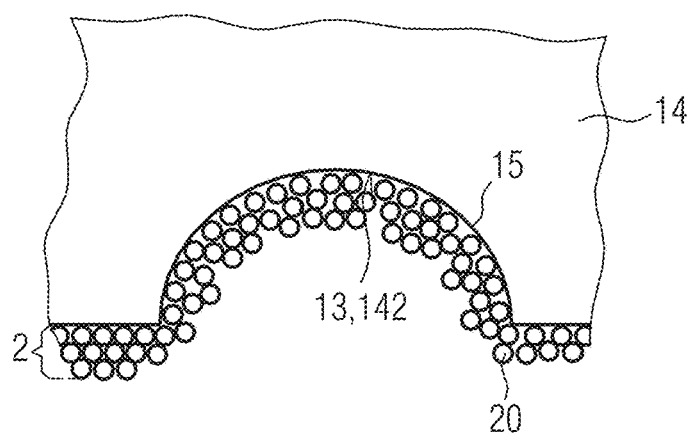

FIG. 1A shows a schematic illustration of a light-emitting device 100 according to an embodiment. FIGS. 1B and 1C show details of the light-emitting device 100 of FIG. 1A. The following description equally applies to FIGS. 1A to 1C.

The light-emitting device 100 comprises a light-emitting semiconductor chip 1. The light-emitting semiconductor chip 1 has a semiconductor layer sequence 10 comprising at least one light-emitting semiconductor layer 11 which emits light during the operation of the light-emitting semiconductor chip 1. By means of electrical contacts in the form of electrode layers 12 an electrical current can be applied to the light-emitting semiconductor layer 11 for operating the light-emitting semiconductor chip 1. For instance, the semiconductor layer sequence 10 can be based on InAlGaN and can be configured to produce ultraviolet, blue or green light. Alternatively, the semiconductor layer sequence 10 can be based on another semiconductor material as described in the general part.

The light generated in the light-emitting semiconductor layer 11 during operation of the light-emitting semiconductor chip 1 is emitted from the chip 1 via a light-outcoupling surface 13. Opposite the light-outcoupling surface 13, the semiconductor chip 1 has a rear-side surface 13'. The light-outcoupling surface 13 and the rear-side surface 13' are connected to one another by means of side surfaces 13". The light generated during operation can also be emitted through the side surfaces 13" and/or through parts of the rear-side surface 13' in addition to the light-outcoupling surface 13.

On the light-outcoupling surface 13, a wavelength conversion layer 2 is arranged, which comprises quantum dots (QDs) 20.

Light emitted by the light-emitting semiconductor layer 11 can be absorbed by the QDs 20 and converted to light with a different wavelength. Accordingly, the light produced by the light-emitting semiconductor layer 11 can also be denoted as pump light for the QDs 20. The wavelength conversion layer 2 with the QDs 20 is integrated into the light-emitting semiconductor device 100 as described in further detail below.

Furthermore, the light-emitting semiconductor chip 1 has a substrate 14, which can be a growth substrate or a carrier substrate. The substrate 14 has a first main surface 141 and a second main surface 142. The semiconductor layer sequence 10 is arranged on the first main surface 141, while the second main surface 142 is the light-outcoupling surface 13. In the shown embodiment, the substrate 14 is a growth substrate, onto which the semiconductor layer sequence 10 is grown. The electrode layers 12 can be arranged on the same side of the semiconductor layer sequence 10 which is the rear-side surface 13', so that, by way of example, the light-emitting semiconductor chip 1 is formed as a so-called flip-chip.

On the second main surface 142 of the substrate, and thus on the light-outcoupling surface 13, the light-emitting semiconductor chip 1 has a surface structure 15, onto which the wavelength conversion layer 2 is directly applied. Since in the shown embodiment the second main surface 142 is the light-outcoupling surface 13 and has the surface structure 15, the wavelength conversion layer 2 is applied directly on the light-outcoupling surface 13. Preferably, the surface structure has structure sizes in the order of micrometers.

As shown in the detailed view in FIG. 1B, the substrate 14 can have a further surface structure 16 on the first main surface 141. Preferably, the further surface structure is in the order of micrometers. In particular, the first main surface 141 can be a substantially flat and two-dimensionally designed surface, on which a plurality of three-dimensionally designed surface elements is arranged, which project out of the plane formed by the flat surface. The three-dimensionally designed surface elements are formed as elevations, which extend upwards away from the flat surface. The surface elements can be round and in particular circular when viewed along the vertical direction, and therefore the surface elements can be designed as conical elevations. Alternatively, the further surface structure 16 can comprise surface elements which have an angular, for example a hexagonal cross-section when viewed along the vertical direction, and therefore the surface elements can also be designed as pyramidal elevations on the flat surface. Alternatively, the surface elements can be designed as indentations projecting from the flat surface into the substrate 14. Similarly to the previously described elevations, the indentations can, for example, be conical or pyramidal.

In the shown embodiment, the substrate 14 can comprise or be made of sapphire, i.e. aluminum oxide. In particular, the substrate 14 can be designed as a sapphire wafer, on which the semiconductor layer sequence 10 is grown in a large-scale manner. The separation of the wafer with the grown semiconductor layer sequence allows a plurality of light-emitting semiconductor chips to be produced. The flat surface of the first main surface 141 is preferably formed by a crystallographic c surface or (−c) surface of the aluminum oxide, which is particularly suitable for growing nitride-based semiconductor materials. Accordingly, the surfaces of the surface elements of the further surface structure 16 are formed by a plurality of other crystal surfaces in compliance with their orientation relative to the flat surface. Alternatively to the embodiment shown, the substrate 14 can, for example, also comprise a first main surface 141 formed by silicon or silicon carbide and can be correspondingly designed, for example, as a silicon wafer or a silicon carbide wafer. Furthermore, another possibility is that the substrate 14 comprises or consists of another material stated in the general section above. Moreover, the first main surface 141 can be embodied without the further surface structure 16.

The wavelength conversion layer 2 can be preferably deposited on the surface structure 15 by a method chosen from drop-casting, inkjet printing, layer transfer. The QDs 20 can be dispersed in a solvent, which can be hexane or chloroform or other non-polar solvents, and the dispersion can be deposited on the surface. Afterwards, the solvent can be evaporated so that substantially only the QDs 20 remain on the surface. As shown in the detailed view in FIG. 1C, the wavelength conversion layer 2 substantially consists of the QDs 20 and is free of an organic matrix material or other filler material. Accordingly, the wavelength conversion layer 2 is not formed as a composite having a matrix material or filler material such as polymer or other organic materials. Rather, the wavelength conversion layer 2 is formed by an assembly of the QDs 20, wherein the wavelength conversion layer 2 is formed by the deposition process. Consequently, the wavelength conversion layer 2 is not a free standing component as usually used in the art, but is an integrated part of the light-emitting device 1 that cannot be removed without being destroyed.

Due to the surface structure 15, a coffee-stain-like effect can be avoided during the evaporation of the solvent, so that a homogeneous covering of the light-outcoupling surface 13 with the QDs 20 can be achieved. The wavelength conversion layer 2 thus forms a conformal coating of the surface structure 15. In other words, the wavelength conversion layer 2 covers the surface structure 15 in such way that the structure of the wavelength conversion layer 2 on the side remote from the surface structure 15 at least partly resembles the surface structure 15. It is also possible that the wavelength conversion layer 2 can at least partly planarize the surface structure.

Figure 2A:
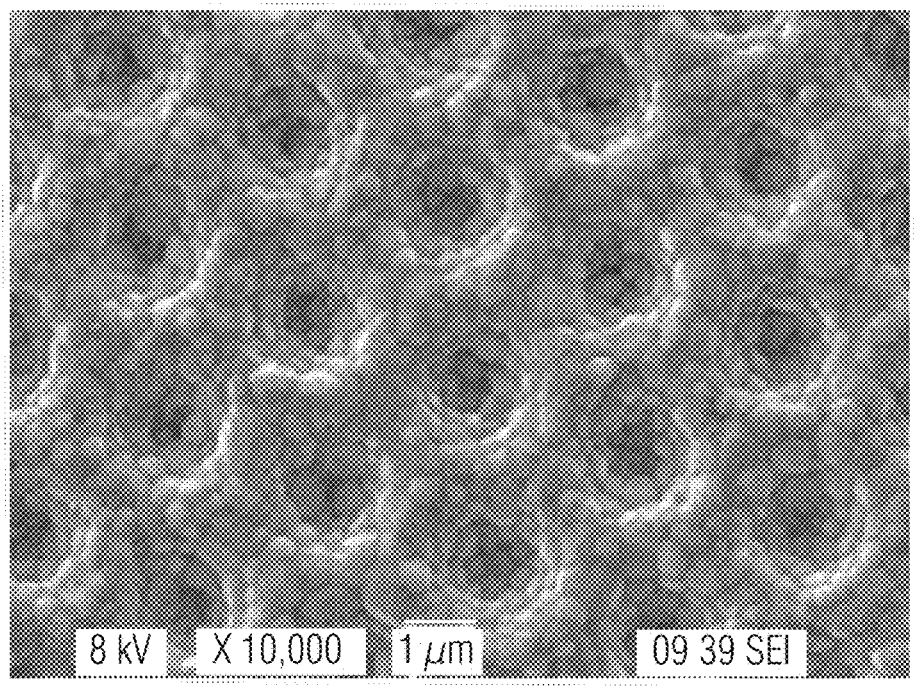
FIGS. 2A and 2B show electron microscope images of a wavelength conversion layer of light-emitting devices according to further embodiments.
Figure 2B:
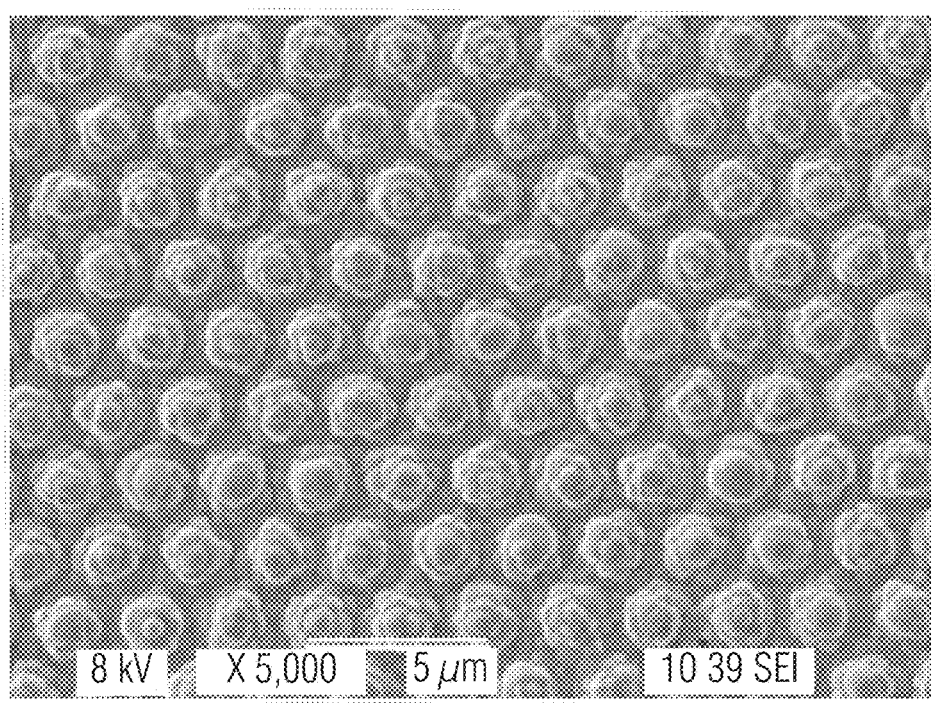

As shown in FIGS. 1A and 1C, the surface with the surface structure 15 can be a substantially flat and two-dimensionally designed surface, on which a plurality of three-dimensionally designed surface elements is arranged, which project out of the plane formed by the flat surface or project from the flat surface into the element with the surface structure 15. Thus, the surface elements can for instance be elevations in the form of tips and/or peaks or indentations in the form of pits and/or crevices and/or grooves. When viewed along the vertical direction, the surface elements can have a polygonal or round cross-section. In the shown embodiment, the surface structure 15 comprises half-sphere-shaped crevices. FIG. 2A shows an SEM (scanning electron microscope) image of a surface structure with the crevices arranged in a hexagonal order. FIG. 2B shows an SEM image of another surface structure with peaks arranged in a hexagonal order. In both cases, it can be clearly seen that the surface structure is conformally covered by the wavelength conversion layer substantially consisting of the QDs.

Since the wavelength conversion layer 2 with the QDs 20 is deposited directly on the surface structure 15 on the light-outcoupling surface 13, which in the case of the embodiment of FIGS. 1A to 1C is a surface of the substrate 14, the light-emitting semiconductor chip 1 provides a mechanically solid, thermally well conductive carrier for holding the QDs 20 in close vicinity to the light-emitting semiconductor layer 11 that generates the pump light. This arrangement improves upon previously known free standing QD solutions requiring a substrate made from (porous) ceramic, glass or other materials for supporting the QDs. The integrated arrangement of the QDs 20 allows for an on-chip QD converter, which is superior in terms of a decreased light loss due to reduced scattering and provides a high conversion efficiency. In particular, the wavelength conversion layer can be embodied in such way that a full conversion is possible, i.e. that substantially all light emitted by the light-emitting semiconductor layer towards the wavelength conversion layer is converted by the QDs. Furthermore, it provides superior thermal properties with the possibility of active cooling of the entire structure.

Figure 3A:
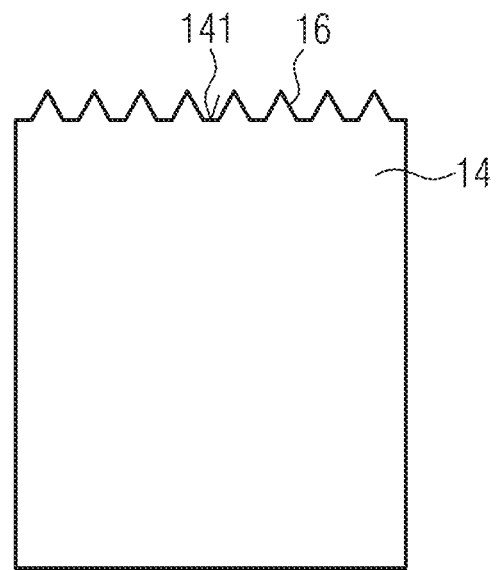
FIGS. 3A to 3D show schematic illustrations of method steps of a method for manufacturing a light-emitting device according to a further embodiment.
Figure 3B:
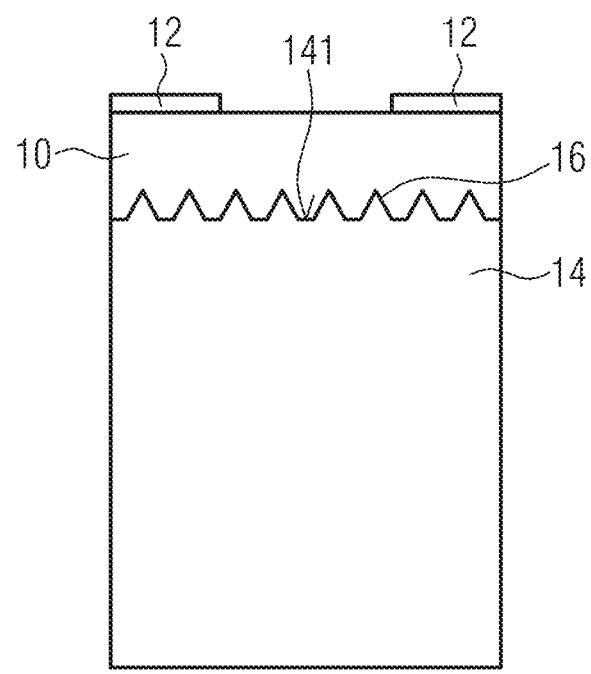

FIGS. 3A to 3D show method steps of a method for manufacturing the light-emitting device 100 according to the embodiment of FIGS. 1A to 1C. As shown in FIG. 3A, in a first step a substrate 14 is provided, which has a first main surface 141 with the further surface structure 16 as explained in connection with FIGS. 1A to 1C. Alternatively, the substrate 14 can also be provided with a flat first main surface 141 without the further surface structure 16. In particular, the substrate 14 can be provided as a substrate wafer so that the following method steps can be performed in a wafer-based process. The substrate 14, which can be, for instance, a sapphire substrate as explained above, is a growth substrate, on which the semiconductor layer sequence 10 is grown as shown in FIG. 3B. The semiconductor layer sequence 10 has a light-emitting semiconductor layer and can be provided with electrode layers 12 as explained above.

Figure 3C:
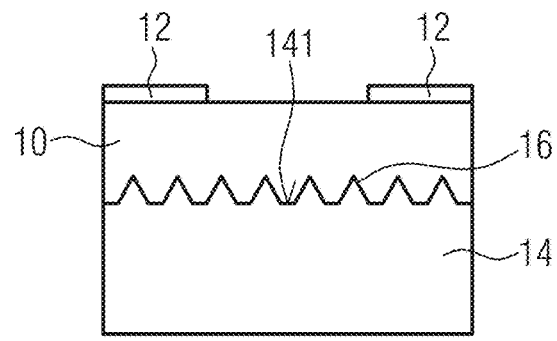
Figure 3D:
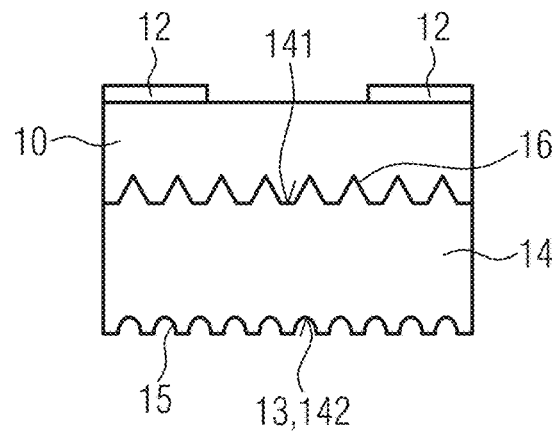

Since the substrate 14 provided as a growth substrate wafer has a thickness that is much bigger than the desired substrate thickness in the final light-emitting semiconductor chip, the substrate 14 is thinned in a further method step in order to reduce the substrate thickness, as shown in FIG. 3C. The thinning can be done for instance by etching or grinding. Typically, the thickness of the substrate 14 is reduced to about 150 µm. Alternatively, the final substrate thickness can be greater or smaller, depending on the desired properties of the substrate. Afterwards or in connection with the thinning process, the surface structure 15 is produced on the side of the substrate 14 remote from the first main surface 141, thereby forming the second main surface 142 with the surface structure 15, as shown in FIG. 3D. The surface structure 15 can be formed for instance by an etching process. As described above, the second main surface 142 of the substrate 14 forms the light-outcoupling surface 13.

In a further method step the wavelength conversion layer with QDs is then applied to the light-outcoupling surface 13 and the wafer is singulated so that a plurality of light-emitting devices 100 as shown in FIGS. 1A to 1C is produced.

Figure 4A:
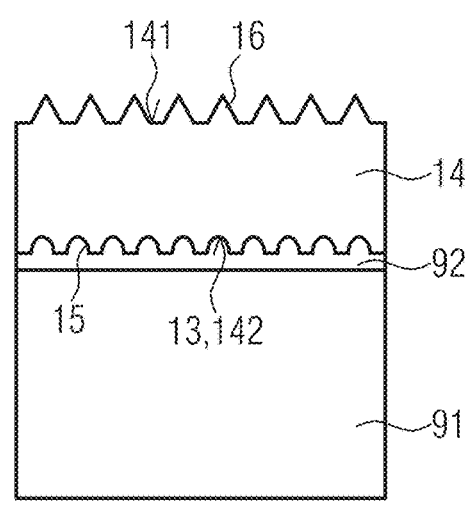
FIGS. 4A to 4C show schematic illustrations of method steps of a method for manufacturing a light-emitting device according to a further embodiment.
Figure 4B:
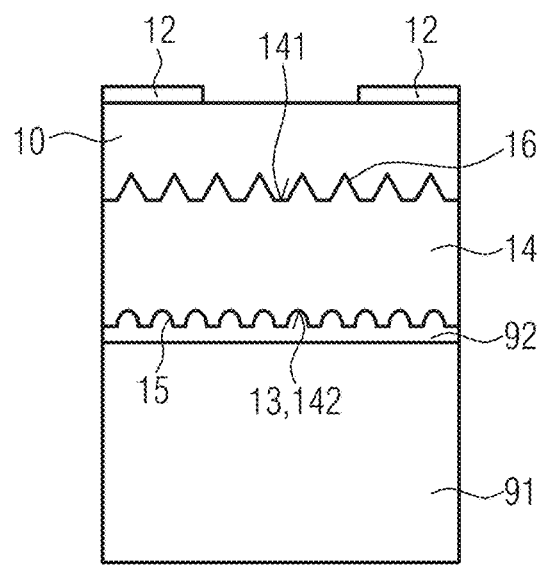
Figure 4C:
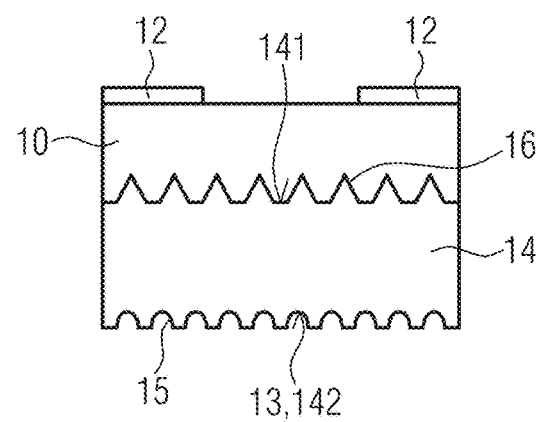

FIGS. 4A to 4C show method steps of a method for manufacturing the light-emitting device 100 of FIGS. 1A to 1C according to a further embodiment. The substrate 14 is provided with a first main surface 141 and a second main surface 142, wherein the second main surface 142 is provided with the surface structure 15 and the first main surface 141 is provided with the further surface structure 16. Alternatively, the substrate 14 can be provided also with a flat first main surface 141 without the further surface structure 16. Consequently, in contrast to the embodiment of FIGS. 3A to 3D, the substrate 14 is provided as a wafer with two structured main surfaces and a thickness which corresponds to the desired final substrate thickness in the light-emitting device. Since that thickness is usually too small for a sufficient stability in the following process steps, the substrate 14 is mounted with the second main surface 142 on a temporary carrier 91 by means of a connection layer 92, which can for instance be an adhesive. The assembly formed by the temporary carrier 91 and the substrate 14 has a thickness which can be typically much more than about 150 µm and provides a sufficient stability.

As shown in FIG. 4B, the semiconductor layer sequence 10 and the electrode layers 12 are deposited on the first main surface 141 as explained above. Afterwards, as shown in FIG. 4C, the temporary carrier 91 and the connection layer 92 are removed by a lift-off process to release the substrate 14 with the chip layers deposited thereon from the temporary carrier 91. As described above, the now uncovered second main surface 142 of the substrate 14 forms the light-outcoupling surface 13. In a further method step the wavelength conversion layer with QDs is applied to the light-outcoupling surface 13 and the wafer is singulated into a plurality of light-emitting devices 100 as shown in FIGS. 1A to 1C.

In the following Figures further embodiments of the light-emitting device 100 are shown, which are modifications of the previously described embodiments. The following description therefore mainly concentrates on the difference to the foregoing embodiments.

Figure 5:
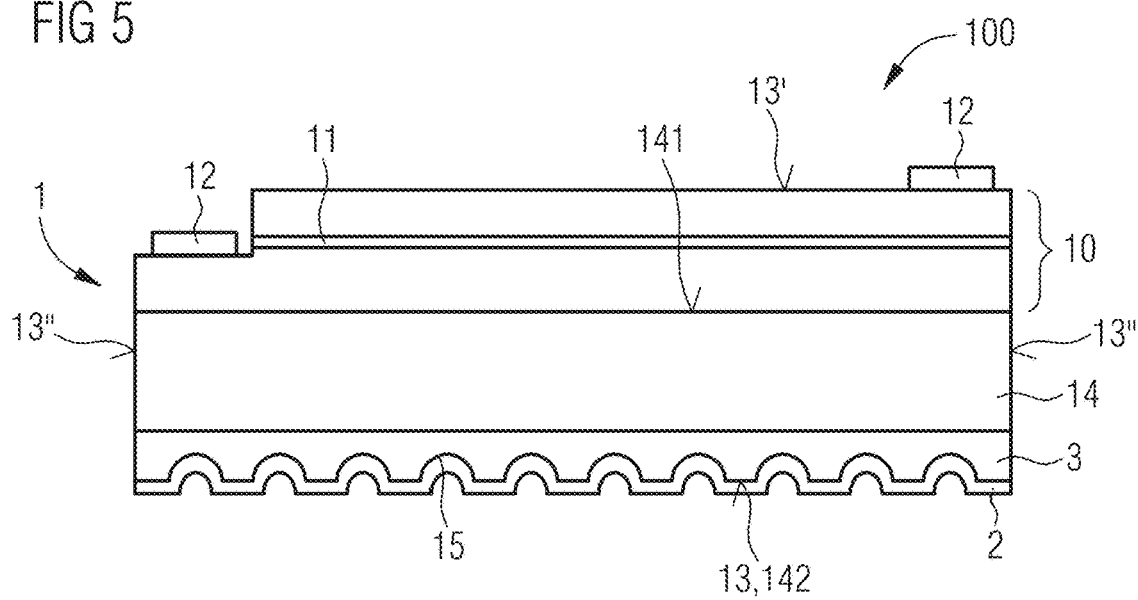
FIGS. 5 to 7 show schematic illustrations of light-emitting devices according to further embodiments.

In FIG. 5 a further embodiment of the light-emitting device 100 is shown, which has an interlayer 3 that is arranged on a surface of the light-emitting semiconductor chip 1. In particular, the interlayer 3 is arranged on, preferably directly on the light-outcoupling surface 13. The interlayer 3 can be deposited for example by a pulsed laser deposition (PLD) process or can be glued to the second main surface 142. As shown in FIG. 5, the light-outcoupling surface 13, which is the second main surface 142 of the substrate 14 in the present embodiment, can be flat and without a surface structure. Alternatively, the light-outcoupling surface 13 can have a surface structure and the interlayer 3 can be deposited directly on the surface structure of the light-outcoupling surface 13.

The wavelength conversion layer 2 is deposited on the interlayer 3, preferably directly on the interlayer 3. The interlayer 3 has a surface that is remote from the light-outcoupling surface 13 and that has a surface structure 15. As shown, the wavelength conversion layer 2 is directly deposited on the surface structure 15 of the interlayer 3. The surface structure 15 can be embodied as described above.

Preferably, the interlayer 3 comprises or consists of a wavelength conversion material. The wavelength conversion material, which can be different from QDs, can be suitable for converting at least some of the light emitted by the light-emitting semiconductor chip 1 into light with a different wavelength, which can be also different from the wavelength of the light that is emitted by the wavelength conversion layer 2. For instance, the interlayer 3 can comprise a ceramic wavelength conversion material, which can be in the form of a ceramic layer or in the form of particles dispersed in a matrix material. The wavelength conversion material of the interlayer 3 can comprise for example YAG and/or LuAG or another garnet, and can be doped for instance with Ce. The combination of the light-emitting semiconductor chip 1, the wavelength conversion layer 2 with the QDs and the interlayer 3 with the wavelength conversion material can preferably result in a white-light-emitting device 100 with an integrated QD layer.

Figure 6A:
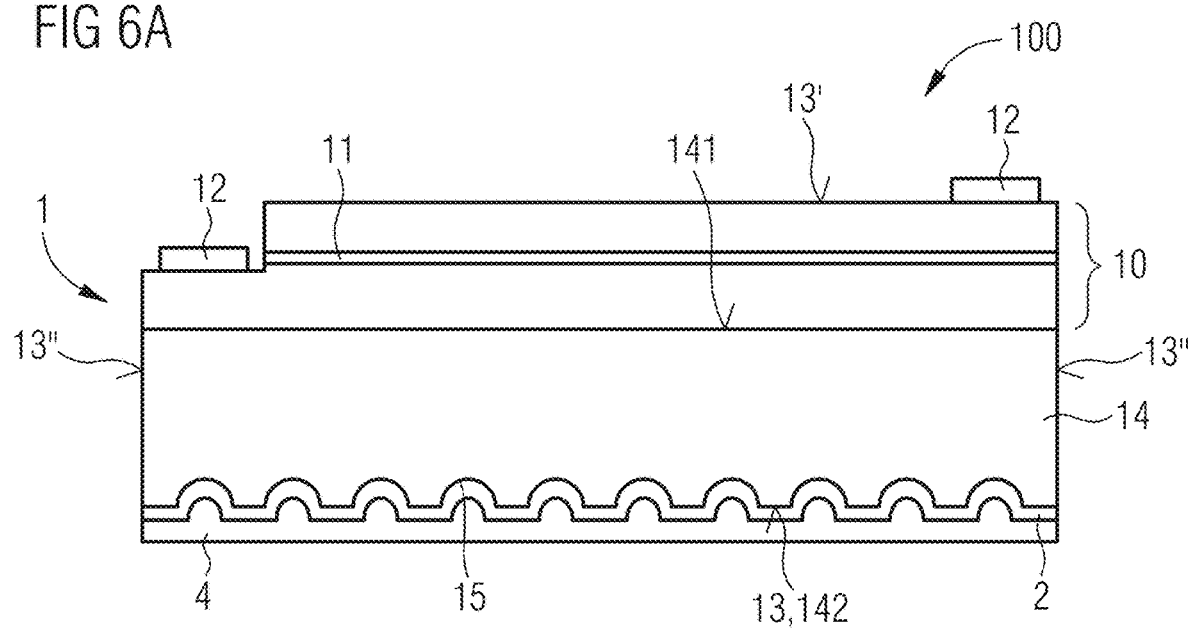
Figure 6B:
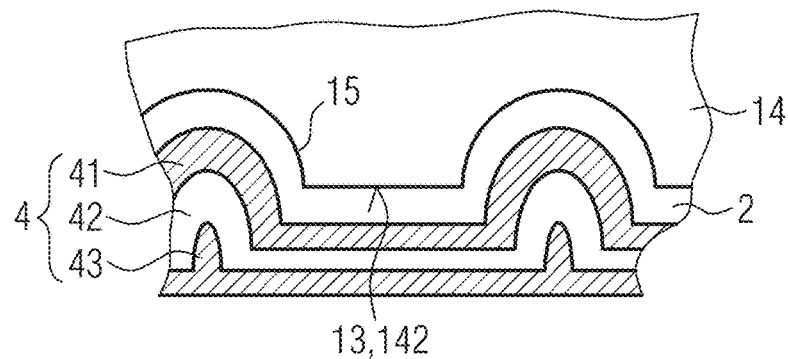

In FIGS. 6A and 6B a further embodiment of the light-emitting device 100 is shown, which has an encapsulation layer 4 that is arranged on the wavelength conversion layer 2. FIG. 6B shows a detailed view of a part of the light-emitting device 100 of FIG. 6A.

Preferably, the encapsulation layer 4 is transparent and can be arranged directly on the wavelength conversion layer 2 as shown in FIGS. 6A and 6B, so that the encapsulation layer 4 is arranged in direct contact with at least some of the QDs of the wavelength conversion layer 2. The encapsulation layer 4 can comprise or consist of one or more layers which are responsible for a barrier effect of the encapsulation layer 4. The one or more layers can comprise one or more inorganic and/or organic materials as described above in the general part. Preferably, the encapsulation layer 4 has a layer sequence having a plurality of layers, for instance a plurality of only inorganic layers or a plurality of inorganic and organic layers, which are alternately arranged on top of each other. By way of example, in the detailed view in FIG. 6B three layers 41, 42, 43 of the encapsulation layer 4 are shown. Alternatively, the encapsulation layer 4 can have less than or more than three layers.

Throughout the embodiments explained above, the light-outcoupling surface 13 is formed by the second main surface 142 of the substrate 14. In this way it is possible to manufacture the light-emitting device 100 as a conversion light-emitting device utilizing a 1- or 2-side structured-surface substrate, in particular made from sapphire, and an integrated QD film formed by the wavelength conversion layer 2 deposited on one of the structured surfaces of the substrate 14 or of an interlayer 3 on the substrate 14. By introducing a suitable topography on the non-epitaxy side of the substrate it is possible to use the conventional process flow for manufacturing the light-emitting semiconductor chip in combination with the incorporation of the wavelength conversion layer, specifically formed by QDs. As explained above, after fabrication of the light-emitting semiconductor chip, which can be for instance a blue-light-emitting semiconductor chip, the QD film is deposited on the surface structure.

Figure 7:
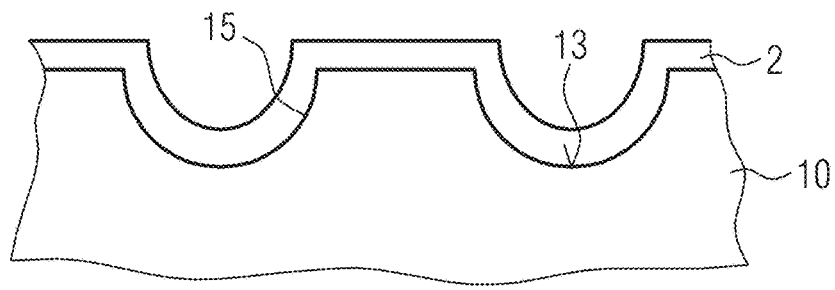

Furthermore, it is also possible that the light-emitting semiconductor chip comprises a carrier substrate, to which the semiconductor layer sequence has been transferred after having grown the semiconductor layers on a growth substrate. In this case, the light-outcoupling surface can be formed by another surface of the light-emitting semiconductor chip. For example, the light-outcoupling surface 13 can be a surface of the semiconductor layer sequence 10 as shown in the detailed view in FIG. 7. The wavelength conversion layer 2 can be deposited directly on a surface structure 15 on the light-outcoupling surface 13 of the semiconductor layer sequence 10. Alternatively, an interlayer, which can comprise a transparent material and/or a wavelength conversion material, can be arranged on the light-outcoupling surface 13 of the semiconductor layer sequence 10 and the wavelength conversion layer 2 can be deposited on the interlayer.

Since in all embodiments the wavelength conversion layer with the QDs is an integral part of the light-emitting device, it is possible to fabricate a solid QD-containing assembly with the possibilities of improved control and stability of the position of the QDs as well as protection and encapsulation of the QDs. Furthermore, the integrated QD containing wavelength conversion layer allows for an improved color adjustment of the light-emitting device. Since the deposition of the wavelength conversion layer with the QDs can be integrated in a conventional design and process flow for manufacturing light-emitting semiconductor chips, a cost reduction in comparison to approaches with free standing QD converters is possible.

Alternatively or additionally to the features described in connection with the Figures, the embodiments shown in the Figures can comprise further features described in the general part of the description. Moreover, features and embodiments of the Figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A light-emitting device, comprising
    a light-emitting semiconductor chip having a substrate with a first main surface and a second main surface, further having a semiconductor layer sequence comprising at least one light-emitting semiconductor layer, wherein the semiconductor layer sequence is arranged on and completely in direct contact with the first main surface, and further having a light-outcoupling surface, wherein the light-outcoupling surface is the second main surface, and wherein a first surface structure is on the second main surface, wherein the first surface structure comprises indentations which project into the substrate from a flat surface of the second main surface and further comprises elevations which extend upwards away from the flat surface; and
    a wavelength conversion layer arranged on the light-outcoupling surface, wherein the wavelength conversion layer substantially consists of quantum dots, wherein the wavelength conversion layer is disposed directly on the first surface structure, wherein the wavelength conversion layer is a conformal coating of the first surface structure, wherein the substrate is a growth substrate or a carrier substrate for the semiconductor layer sequence, and wherein the wavelength conversion layer is integrated in the light-emitting device and cannot be removed without being destroyed.

2. The light-emitting device according to claim 1, wherein the wavelength conversion layer is free of an organic matrix material.

3. The light-emitting device according to claim 1, wherein the light-outcoupling surface is a surface of the semiconductor layer sequence.

4. The light-emitting device according to claim 1, wherein the first main surface has a second surface structure and the semiconductor layer sequence is grown on the second surface structure.

5. The light-emitting device according to claim 1, wherein an interlayer is arranged on the light-outcoupling surface,
wherein the interlayer has a surface that is remote from the light-outcoupling surface and has a third surface structure.

6. The light-emitting device according to claim 5, wherein the interlayer comprises a wavelength conversion material.

7. The light-emitting device according to claim 1, further comprising an encapsulation layer is disposed on the wavelength conversion layer.

8. The light-emitting device according to claim 7, wherein the encapsulation layer comprises a plurality of layers.

9. The light-emitting device according to claim 1, wherein the substrate is a sapphire substrate.

10. The light-emitting device according to claim 1, wherein the second main surface of the substrate is contiguously in direct contact with the semiconductor layer sequence between edges of the substrate.

11. A method for manufacturing a light-emitting device, comprising
providing a light-emitting semiconductor chip, the light-emitting semiconductor chip having a substrate with a first main surface and a second main surface, a semiconductor layer sequence comprising at least one light-emitting semiconductor layer, wherein the semiconductor layer sequence is grown on the first main surface and is completely in direct contact with the first main surface, and a light-outcoupling surface, wherein the light-outcoupling surface is the second main surface;
providing a first surface structure on the light-outcoupling surface, wherein the first surface structure comprises indentations which project into the substrate from a flat surface of the second main surface and further comprises elevations which extend upwards away from the flat surface; and
depositing a wavelength conversion layer on the light-outcoupling surface, wherein the wavelength conversion layer substantially comprises quantum dots, wherein the wavelength conversion layer is deposited directly on the first surface structure, wherein the wavelength conversion layer is a conformal coating of the first surface structure, and wherein the wavelength conversion layer is integrated in the light-emitting device and cannot be removed without being destroyed.

12. The method according to claim 11, wherein the wavelength conversion layer is deposited by at least one of drop-casting, inkjet printing, or layer transfer.

13. The method according to claim 11, wherein the first surface structure is provided at the second main surface before the semiconductor layer sequence is arranged on the first main surface;
wherein the providing the substrate comprises:
arranging the substrate with the second main surface on a temporary carrier before the semiconductor layer sequence is arranged on the first main surface, and
removing the temporary carrier after the arrangement of the semiconductor layer sequence on the first main surface, thereby exposing the first surface structure on the second main surface.

14. The method according to claim 11, wherein the first surface structure is provided on the second main surface after the semiconductor layer sequence is arranged on the first main surface.

15. The method according to claim 11, wherein the substrate is thinned before the first surface structure is provided on the second main surface and after the semiconductor layer sequence is arranged on the first main surface.

16. A light-emitting device, comprising
a light-emitting semiconductor chip having a semiconductor layer sequence comprising at least one light-emitting semiconductor layer and a light-outcoupling surface; and
a wavelength conversion layer arranged on the light-outcoupling surface, wherein the wavelength conversion layer substantially consists of quantum dots, and wherein the wavelength conversion layer is integrated in the light-emitting device and cannot be removed without being destroyed.

* * * * *